US005568049A

United States Patent [19]
Bucholtz

[11] Patent Number: 5,568,049
[45] Date of Patent: Oct. 22, 1996

[54] FIBER OPTIC FARADAY FLUX TRANSFORMER SENSOR AND SYSTEM

[75] Inventor: Frank Bucholtz, Crofton, Md.

[73] Assignee: The United States of America as represented by the Secretary of the Navy, Washington, D.C.

[21] Appl. No.: 140,389

[22] Filed: Oct. 22, 1993

[51] Int. Cl.$^6$ .................... G01R 33/032; G01R 19/00
[52] U.S. Cl. ............................. 324/244.1; 324/96
[58] Field of Search ............................ 324/244, 244.1, 324/96; 356/364; 250/227.14, 227.17

[56] References Cited

U.S. PATENT DOCUMENTS 3,621,390  11/1971  Von Willisen ................ 324/244.1

FOREIGN PATENT DOCUMENTS

WO87/04798  8/1987  WIPO ................... 324/244.1

OTHER PUBLICATIONS

G. W. Day and A. H. Rose, "Faraday Effect Sensors: The State of the Art", SPIE vol. 985 Fiber Optic and Laser Sensors VI pp. 138–150 (1988).
A. D. Kersey, F. Bucholtz and A. Dandridge, "Sensitivity-–Bandwidth Limitations In Optical–Fibre Farady–Rotation Current Sensors", International Journal of Optoelectronics, vol. 3, No. 4, pp. 323–332, (1988).
F. Bucholtz, K. P. Koo, A. D. Kersey and A. Dandridge, "Fiber Optic Magnetic Sensor Development", SPIE vol. 718, Fiber Optic and Laser Sensors IV, pp. 56–65 (1986).

Primary Examiner—Gerard R. Strecker
Attorney, Agent, or Firm—Thomas E. McDonnell; George Jameson

[57] ABSTRACT

A fiber optic Faraday flux transformer sensor is disclosed which comprises: a closed loop of wire being responsive to a first time-varying magnetic field from a remote source for producing a secondary time-varying magnetic field which varies as a function of the first time-varying magnetic field, and an optical fiber loop having a plurality of turns arranged in a preselected configuration adjacent to the closed loop of wire and adapted to receive and pass therethrough input light having a fixed state of linear polarization. The optical fiber loop is responsive to the secondary time-varying magnetic field and to the input light for producing light having a polarization state which changes as a function of the secondary time-varying magnetic field applied thereto. In a system implentation, an optical source transmits light having a linear state of polarization to a first polarizer, which selects and sends a fixed predetermined state of polarization to the fiber optic Faraday flux transformer sensor. A second polarizer converts the resultant light from the fiber optic Faraday flux transformer sensor into an output light which changes in intensity as a function of the changing polarization state of the resultant light. A photodetector converts this output light into an electrical signal which varies in amplitude as a function of the time-varying magnetic field from the remote source.

2 Claims, 5 Drawing Sheets

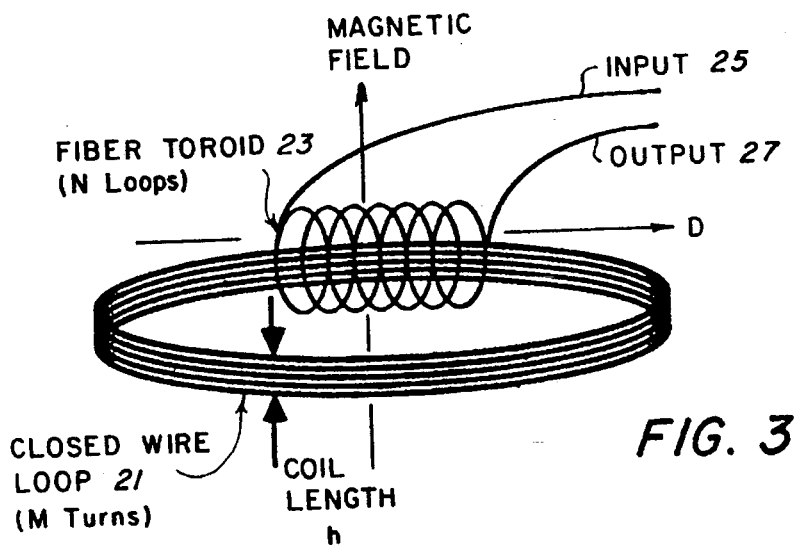
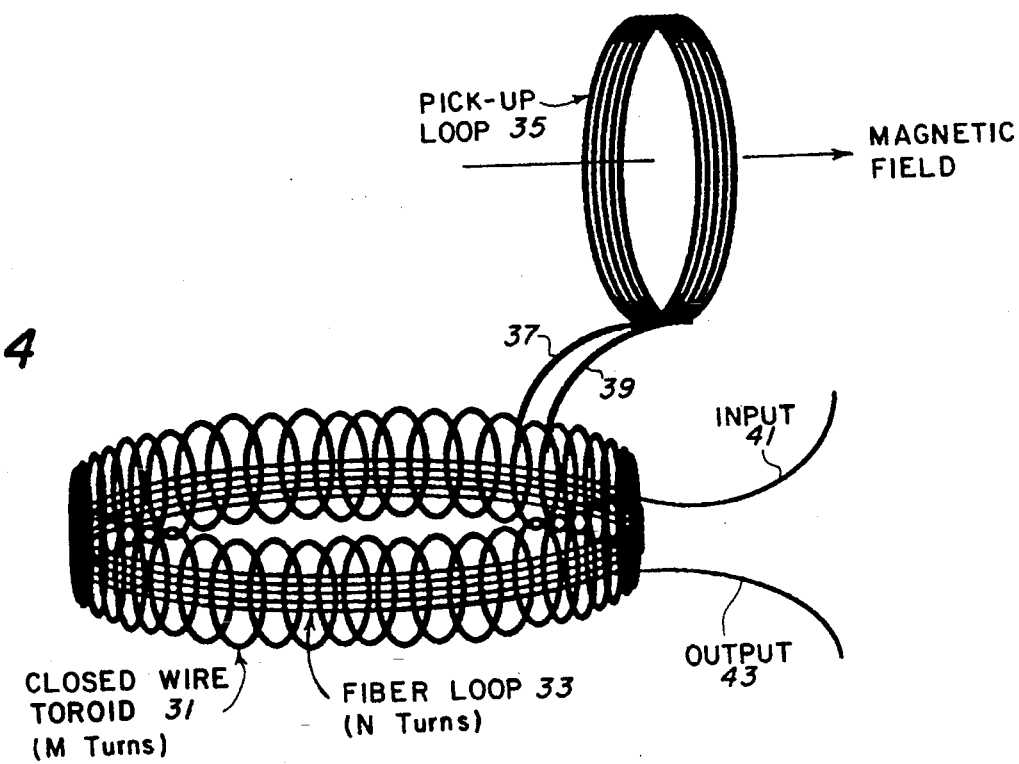

FIBER OPTIC FARADAY FLUX TRANSFORMER SENSOR AND SYSTEM

SPECIFICATION

1. Field of the Invention

The present invention relates to Faraday sensors and more particularly to a novel fiber optic Faraday flux transformer sensor and system for sensing a time-varying magnetic field from a remote source by utilizing a suitably arranged closed loop of wire as the flux detector and an optical fiber loop associated with the closed loop of wire to produce in the associated optical fiber loop a Faraday rotation angle of light that is proportional to the time-varying magnetic field in the closed loop of wire.

2. Description of the Related Art

Optical fibers have been used in the measurement of magnetic fields and electrical currents. One basic sensing mechanism is the Faraday effect in which the plane of polarization of linearly polarized light propogating in an optically active medium depends on a magnetic field. [See: *Faraday Effect Sensors: The State of the Art* by G. W. Day and A. H. Rose, SPIE Vol. 985, pages 138–150, Fiber Optic and Laser Sensors VI (1988)]. For light travelling along a path P in an optical fiber, the rotation of the angle of polarization of light exiting the fiber referenced to light entering the fiber, $\theta$, is given in terms of the Verdet constant V of the fiber core material and the line integral of the magnetic field H along the fiber path P, as shown in Eq. (1) below.

$$\theta = V \int_P H \cdot dl \tag{1}$$

Two typical prior art configurations are shown in FIGS. 1 and 2. In FIG. 1, N turns or loops of a fiber coil 11 are shown wrapped around a single conductor 13 carrying current i. Due to the rotational symmetry, the Faraday rotation $\theta = NVi$, independent of the radius of the fiber coil 11. FIG. 2 also shows N turns or loops of a fiber coil 15, but in this case a wire 17 has been wrapped toroidally M times around the fiber coil 15. Here $\theta = MNVi$, and it can be seen that the loops of the fiber coil 15 and the loops of the wire 17 have a multiplicative effect on the integrated Faraday rotation. In each case, the Faraday rotation results from a magnetic field due to currents generated by an external source (not shown) connected directly to the wire 13 in FIG. 1 or to the ends 19A and 19B of the wire 17 in FIG. 2.

In the absence of conductors, an optical fiber can still function as a magnetic sensor by the mechanism of Eq. (1). For communications grade silica fiber, the Verdet constant is approximately $4.6 \times 10^{-6}$ rad/Ampere ($3.7 \times 10^{-7}$ rad/Gauss.m). Hence, significant (field×fiber length) products are required to produce significant rotations, but advantageously no direct electrical connections to the magnetic sensor are required. Typically, the fiber cannot be coiled into N turns (as in FIG. 1.a) unless the field is solenoidal.

SUMMARY OF THE INVENTION

It is therefore an object of the invention to provide a novel fiber optic Faraday sensor.

Another object of the invention is to provide a novel fiber optic Faraday flux transformer sensor which utilizes a completely closed loop of wire as the flux detector and wherein the Faraday rotation angle is proportional to the changing magnetic flux in the completely closed loop of wire.

Another object of the invention is to provide a novel fiber optic Faraday flux transformer sensor for sensing a time-varying magnetic field from a remote source by utilizing a suitably arranged closed loop of wire as the flux detector and an optical fiber loop associated with the closed loop of wire to produce in the associated optical fiber loop a Faraday rotation angle of light that is proportional to the time-varying magnetic field in the closed loop of wire.

A further object of the invention is to provide a fiber optic Faraday sensing system for measuring a time-varying magnetic field from a remote or hazardous location without the need for any direct electrical connection to the sensing system.

These and other objects of this invention are achieved by providing a novel fiber optic Faraday flux transformer sensor and system for sensing a time-varying magnetic field from a remote source by utilizing a suitably arranged closed loop of wire as the flux detector. The time-varying magnetic field induces current to flow in the closed loop of wire which, in turn, produces a secondary time-varying magetic field in an optical fiber loop associated with the closed loop of wire. This secondary time-varying magnetic field rotates the plane of polarization of light in the associated optical fiber loop to produce in that optical fiber loop a Faraday rotation angle of light that is proportional to the time-varying magnetic field in the closed loop of wire. The polarization rotation in the optical fiber loop can be measured by a variety of detection techniques. One exemplary simple technique consists of two polarizing elements, one acting as a polarizer and the other functioning as an analyzer, followed by a photodetector. (Such an exemplary simple technique is shown and described in relation to FIG. 9.)

BRIEF DESCRIPTION OF THE DRAWINGS

These and other objects, features and advantages of the invention, as well as the invention itself, will become better understood by reference to the following detailed description when considered in connection with the accompanying drawings wherein like reference numerals designate identical or corresponding parts throughout the several views and wherein:

FIG. 3 illustrates a first embodiment of the fiber optic Faraday flux transformer sensor of the invention;

FIG. 4 illustrates a second embodiment of the fiber optic Faraday flux transformer sensor of the invention;

DETAILED DESCRIPTION OF THE PREFERRED EMBODIMENTS

Figure 9:
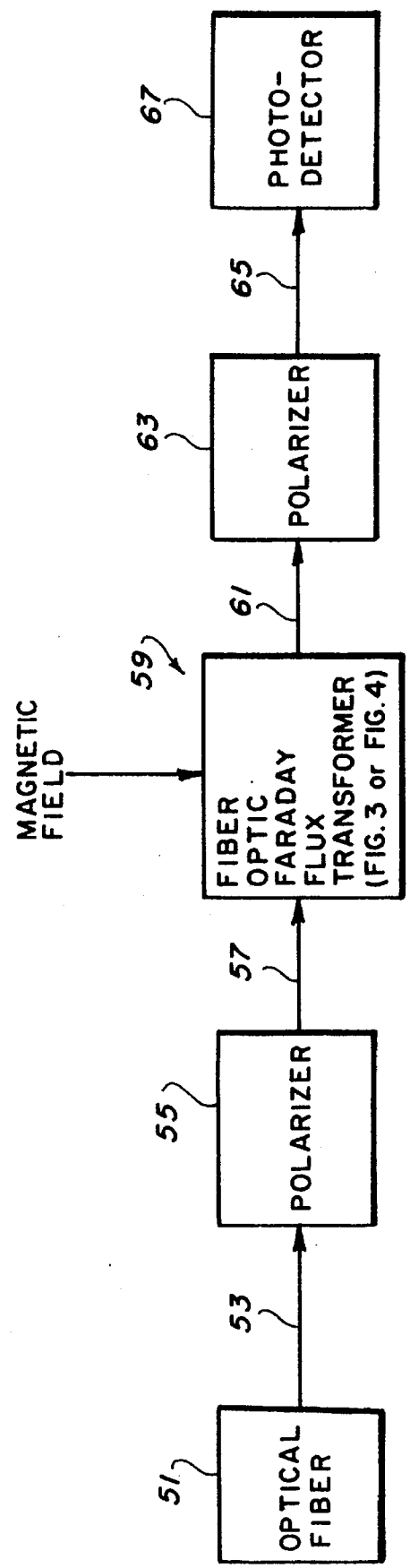
FIG. 9 illustrates an exemplary fiber optic Faraday sensing system for measuring a time-varying magnetic field from a remote source.

Referring now to FIG. 3, a schematic diagram of a first embodiment of the invention is shown. A completely closed loop of wire or closed wire loop 21 ("pick-up loop") of M turns and coil length h operates as a flux detector. An optical fiber of N turns is wound in a toroidal configuration preferably around a portion of the closed wire loop 21 to form a toroid of optical fiber or fiber toroid 23 around the closed wire loop 21. However, it should be realized that the fiber toroid 23 could be formed around the entire closed wire loop 21. The combination of the fiber toroid 23 and the closed wire loop 21 is preferably oriented so that the length of the fiber toroid 23 lies in a direction D orthogonal to the direction of a time-varying magnetic field (from a remote source) to be measured in order to maximize the reception of that magnetic field. Light, having a predetermined fixed state of polarization from a source (FIG. 9), is applied to an input 25 of the fiber toroid 23 and propagates through the fiber toroid 23 to an output 27 of the fiber toroid 23 before returning to the source (FIG. 9).

In operation, the time-varying magnetic field, which is perpendicular to the plane of the closed wire loop 21 (as shown in FIG. 3), induces a time-varying current to flow in the closed wire loop 21 according to Lenz's Law. This time-varying current flowing in the closed wire loop 21 will cause a secondary time-varying magnetic field to be produced which cuts across the N loops of the fiber toroid 23 and causes a rotation of the state of polarization (Faraday rotation) of the light propagating through the fiber toroid 23. This secondary time-varying magnetic field varies as a function of the time-varying magnetic field from the remote source. Thus, the polarization state of the light at the output 27 rotates as a function of the secondary time-varying magnetic field applied thereto, which is proportional to the time-varying magnetic field to be measured. As will be explained in relation to FIG. 9, this changing polarization of the light from the fiber optic Faraday flux transformer of FIG. 3 can be transformed into a corresponding change in light intensity which, in turn, can be changed into a corresponding change in voltage amplitude representative of the time-varying magnetic field from the remote source.

FIG. 4 is a schematic diagram of a second embodiment of the invention. A loop of wire is wound in a toroidal configuration to form a closed wire toroid 31 of M turns. An optical fiber is wound in a series of N turns or loops inside of the closed wire toroid 31 to internally form a fiber loop 33. It should be noted that the fiber loop 33 is not wound in a toroidal configuration like the fiber toroid 23 of FIG. 3 is. A wire pick-up loop 35 is displaced away from the closed wire toroid 31 but is serially connected to the closed wire toroid 31 by way of end portions 37 and 39. The pick-up loop 35 is preferably oriented to be perpendicular to the direction of a time-varying magnetic field (from a remote source) to be measured in order to maximize the reception of that magnetic field. Light, having a predetermined fixed state of polarization from a source (FIG. 9), is applied to an input 41 of the fiber loop 33 and propagates through the fiber loop 33 to an output 43 of the fiber loop 33.

In operation, the time-varying magnetic field, which is perpendicular to the pick-up loop 35, induces a time-varying current to flow in the serially-connected pick-up loop 35 and wire toroid 31, according to Lenz's Law. This time-varying current flowing in the wire toroid 31 will cause a secondary time-varying magnetic field to be produced all around the wire toroid 31. Since the fiber loop 33 is disposed inside of and around the wire toroid 31, the secondary time-varying magnetic field will cut across the N turns of the fiber loop or coil 33 and cause a rotation of the state of polarization (Faraday rotation) of the light propagating through the fiber loop 33. This secondary time-varying magnetic field varies as a function of the time-varying magnetic field from the remote source. Thus, the polarization state of the light at the output 43 will rotate as a function of the secondary time-varying magnetic field applied thereto, which is proportional to the time-varying magnetic field to be measured. As will be explained in relation to FIG. 9, this changing polarization of the light from the fiber optic Faraday flux transformer of FIG. 4 can be transformed into a corresponding change in light intensity which, in turn, can be changed into a corresponding change in voltage amplitude representative of the time-varying magnetic field from the remote source.

It should be noted at this time that an associated ferromagnetic core could be utilized in the closed wire loop 21 of FIG. 3 and in each of the pick-up loop 35 and closed wire toroid 31 of FIG. 4.

To further aid in understanding the invention, the operation of the embodiment of FIG. 3 will now be analyzed.

For current i in the closed wire loop 21, the Faraday rotation is $\theta = VMNi$, where the current results from the induced emf, $i = V_{emf}/Z$. The coil impedance $Z = [R^2 + \omega^2 L^2]^{1/2}$ where R= coil resistance, L= self-inductance of the pick-up coil, and $\omega/2\pi$= frequency of time varying field.

Consider a magnetic field, $B \sin \omega t$, directed along the axis of the pick-up loop 21 in FIG. 3. The time derivative of the magnetic flux is $d\phi/dt = -\pi r^2 \omega B \cos \omega t$.

Hence, the amplitude of the Faraday rotation per unit applied field at frequency $\omega/2\pi$ is $$\theta_\omega/B = VNM^2\pi r^2 \, \omega[R^2 + \omega^2 L^2]^{1/2} \quad (2)$$

Both R and L can be expressed in terms of parameters of the coil. The coil resistance $R=MR'$, where the resistance per turn, $R'=2\pi r\rho$, where $\rho$ is the wire resistance per unit length. Hence, $R=2\pi r\rho M$. The coil 21 inductance $L=\mu_o \pi r^2 M^2 K/h$ where $\mu_o=4\pi \times 10^{-7}$ Henrys/m, K=a scaling factor which depends on the (radius/length) ratio of the coil 21, and h=length of the coil 21. [See, for example, P. Lorrain and D. Corson, *Electromagnetic Fields and Waves*, W. H. Freeman, pg 347 (1970)]. Hence, Eq. (2) can be rewritten as $$\theta_w/B = VNMr\omega[(2\rho)^2 + (\mu_o MKr/h)^2\omega^2]^{-1/2} \quad (3)$$

As expected the Faraday rotation is linearly proportional to the product of the Verdet constant V and the number of turns of fiber N. However, increasing the number of turns of the fiber toroid 23 does limit the bandwidth of the device. [See: A.D. Kersey, F. Bucholtz, and A. Dandridge, *Sensitivity-bandwidth limitations in optical-fibre Faraday-rotation current sensors*, Intl. J. optoelectronics, 3, pp. 323–332 (1988)]

In the following analysis $\omega$, M, r and $\rho$ are treated as parameters. Typical values of the parameters used in the calculations are given in the following TABLE I. (It should be noted that the numerical values for the parameters used in TABLE 1 were used to generate the theoretical response curves shown in the following FIGS. 6–8.)

TABLE 1

| Parameter | Symbol | Value | Units |
| --- | --- | --- | --- |
| Verdet constant | V | 3.7 | rad/Tesla · meter |
|  |  | $4.6 \times 10^{-6}$ | rad/ampere |
| Number of turns of fiber | N | 100 | † |
| Number of turns of wire | M | 100 | † |

TABLE 1-continued

| Parameter | Symbol | Value | Units |
|---|---|---|---|
| Frequency of magnetic field | $\omega$ | $2\pi \times 100$ | rad/sec |
| Wire coil radius | r | 0.05 | meters |
| Permeability of free space | $\mu_o$ | $4\pi \times 10^{-7}$ | Henries/meter |
| Wire resistance/unit length | $\rho$ | 0.03 | ohms/meter |
| Length of coil | h | 0.005 | meters |
| Coil scale factor | K | 0.12 * | † |

† Dimensionless
* For (r/h) = 10

Figure 5:
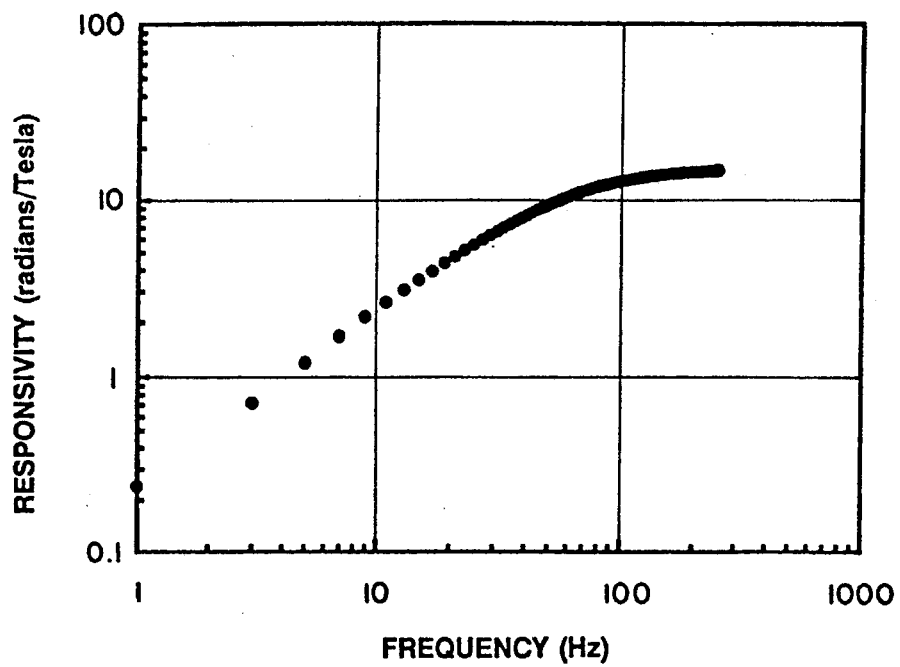
FIGS. 5–8 are graphs illustrating various design criteria useful in understanding and implementing the fiber optic Faraday flux transformer sensor of the invention.

FIG. 5 is a graph which shows the responsivity of the fiber optic Faraday flux transformer sensor of the invention in radians of Faraday rotation per testa of magnetic field applied, as a function of the frequency of the magnetic field. As shown in FIG. 5, the responsivity increases with frequency up to about 100 Hz then is relatively flat thereafter. If a different responsivity with frequency is needed, other design parameters could be changed.

Two frequency-limiting cases will now be considered.
A. Low-frequency limit ($\omega \ll R/L$)

$$q_W/B \ (\omega \ll R/L) = VMN \ r \ \omega/2 \ r . \quad (4)$$

In this frequency regime, the Faraday rotation depends linearly on N, M, r and the frequency $f = \omega/2\pi$.
B. High-frequency limit ($\omega \gg R/L$)

$$q_W/B \ (\omega \gg R/L) = VMh/\mu_o K. \quad (5)$$

In this high frequency limit, the response is independent of frequency. In practice, self capacitance of the wire loop will result in a loop self-resonance frequency which will place an upper limit on the useful range of operating frequencies. It is clear that the parameters of the fiber optic Faraday sensor can be adjusted to provide flat frequency response over almost any desired range of frequencies. In addition, the multiple turn wire loop can form part of a tuned resonant circuit to enhance sensing of fields within a specified narrow range of frequencies. However, sensing at frequencies significantly below 1 Hz will probably be difficult due to the severely reduced sensitivity of the wire loop and increased "1/f type" optoelectronic noise.

Figure 6:
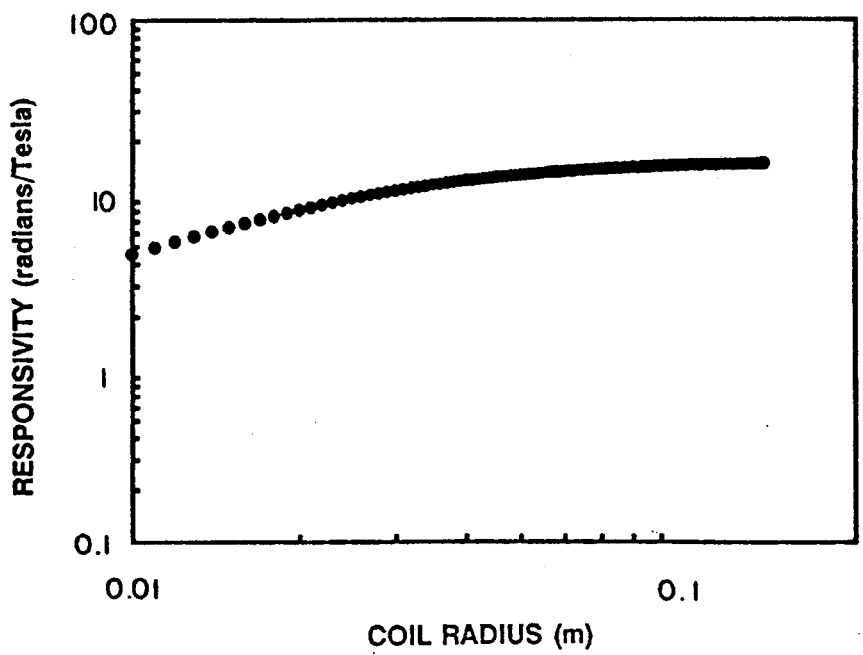

FIG. 6 is a graph which shows the responsivity of the fiber optic Faraday flux transformer sensor of the invention in radians per tesla of magnetic field applied, as a function of the radius of the wire loop or coil. FIG. 6 shows that the responsivity is substantially independent of the coil radius. For practical values of the coil radius, say, r=5–15 cm, the response depends only weakly on radius. This suggests that the temperature coefficient of the sensor due to thermal expansion of the pick-up loop will be small.

Figure 7:
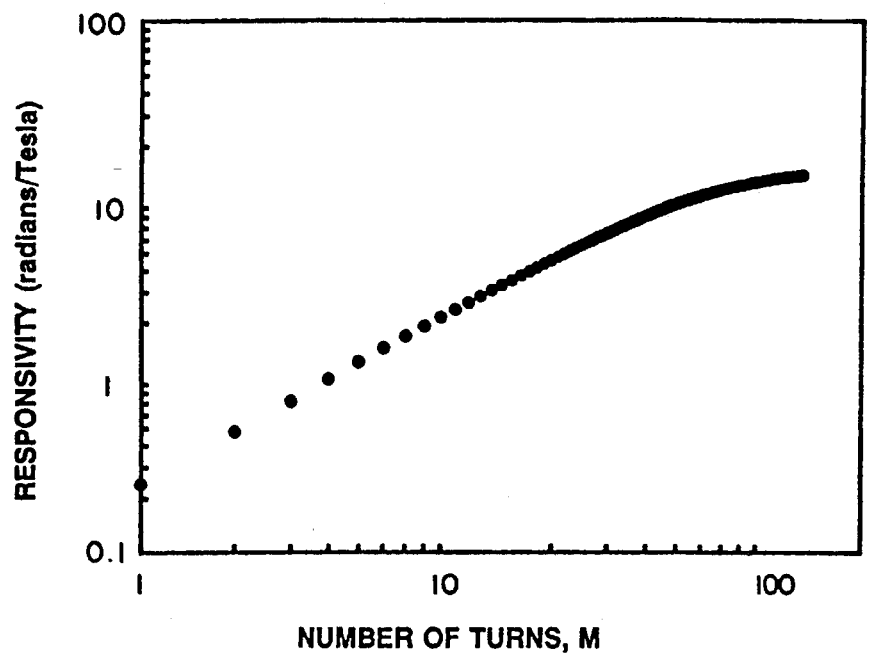

FIG. 7 is a graph which shows the responsivity of the fiber optic Faraday flux transformer sensor of the invention in radians per tesla of magnetic field applied, as a function of the number of turns M of the wire loop. As shown, there is a linear dependence of the response for small numbers of wire loops M. In addition, for the parameter values chosen for these calculations, this linear dependence flattens out above M = 100. Thus, to increase the responsivity of the fiber optic Faraday flux transformer sensor, additional turns of wire loops should be added until about 100 turns is reached.

Figure 8:
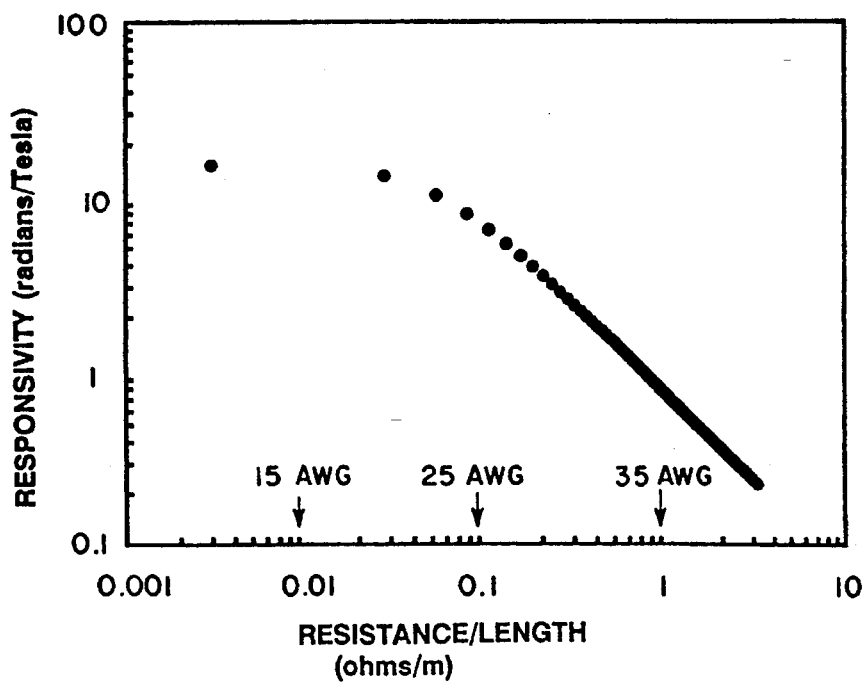

FIG. 8 is a graph which shows the responsivity of the fiber optic Faraday flux transformer sensor of the invention in radians per tesla of magnetic field applied, as a function of the resistance per unit length of the wire of the wire loop. Thus, this responsivity depends on the resistance per unit length of the wire. In other words, this parameter is basically directed to the thickness or gauge of the wire once the number of turns in the wire loop is determined. This coil resistance parameter becomes important in the low-frequency regime where the coil resistance dominates the impedance.

Figure 1:
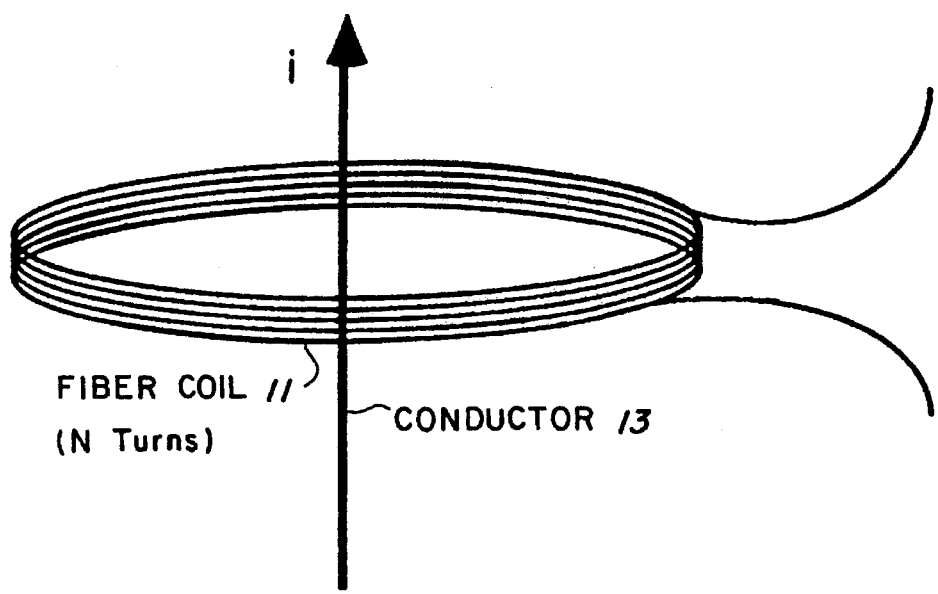
FIG. 1 illustrates a first configuration of a prior art fiber optic Faraday sensor for measuring a magnetic field.
Figure 2:
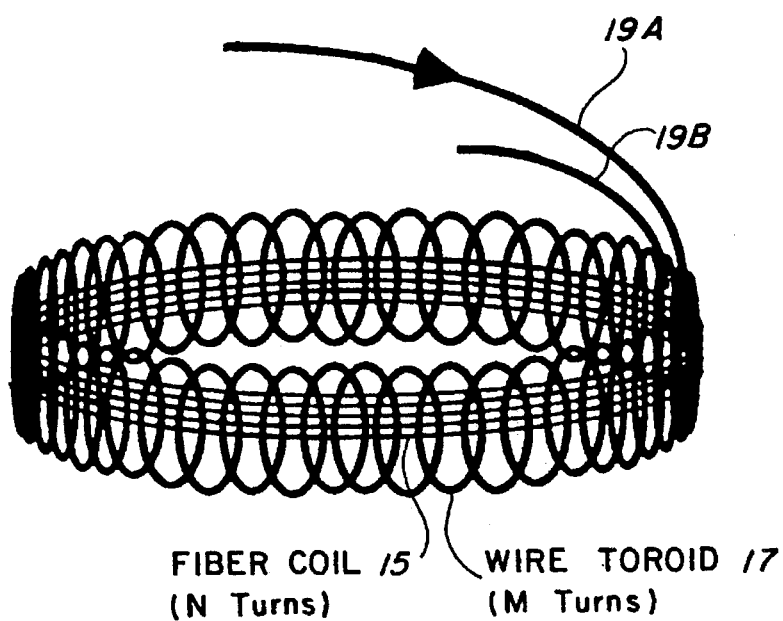
FIG. 2 illustrates a second configuration of a prior art fiber optic Faraday sensor for measuring a magnetic field.

Taken together, FIGS. 5–8 show that useful response can be obtained for practical and realistic sensor parameter values. For an optical power level of 100 µW, the shot-noise limited performance of an optical fiber polarimeter (not shown) leads to a minimum detectable field, assuming $\theta_W B = 10$ rad/Tesla, of approximately 3 nT/$\sqrt{Hz}$, or $3 \times 10^{-5}$ Gauss/$\sqrt{Hz}$. By comparison, the thermal noise limit of the pick-up coil corresponds to minimum detectable fields in the pT range. Hence, the fiber optic Faraday flux transformer sensor, and its system, will be limited by shot noise, and improvements in performance may be obtained by increasing the optical power. The shot-noise-limited minimum detectable field is in the range of values achievable with the prior art fiber optic Faraday sensor configurations shown in FIGS. 1 and 2. Hence, the advantage of no direct electrical contact and multiple turns of wire have been achieved with no degradation in performance compared to previous prior art configurations.

FIG. 9 illustrates an exemplary fiber optic Faraday sensing system for measuring a time-varying magnetic field from a remote source. In operation, an optical source 51, such as a laser, transmits light having a linear state of polarization through an optical fiber 53 to a polarizer 55. The polarizer 55 selects and allows a fixed, predetermined linear state of polarization of that light to pass through the polarizer 55 and through an optical fiber 57 into a fiber optic Faraday flux transformer sensor 59.

The fiber optic Faraday flux transformer sensor 59 can be the previously discussed fiber optic Faraday flux transformer sensor of either FIG. 3 or FIG. 4. As discussed before, the fiber optic Faraday flux transformer sensor 59 is responsive to the applied light having the fixed, predetermined state of linear polarization and to a time-varying magnetic field from a remote or hazardous source (not shown) for producing a light having a polarization state which changes as a function of the time-varying magnetic field from the remote or hazardous source.

The light from the fiber optic Faraday flux transformer sensor 59 propagates through an optical fiber 61 to a polarizer 63. In response to this light having a polarization state which changes as a function of the time-varying magnetic field, the polarizer 63 produces an output light which changes in intensity as a function of the changing polarization state of the light from the fiber optic Faraday flux transformer sensor 59. This output light from the polarizer 63 passes through an optical fiber 65 to a photodetector 67, which converts the output light to an output electrical signal which varies in amplitude as a function of the time-varying magnetic field from the remote source. This output electrical signal is a function of the strength of the time-varying magnetic field from the remote or hazardous source and, hence, constitutes a measurement of that magnetic field. The output electrical signal could be applied to an oscilloscope, a spectrum analyzer, a data recorder, a voltmeter or a computer (not shown) for subsequent viewing, storage or other processing.

The fiber optic Faraday flux transformer sensor (and associated system) of the invention has the dual advantages of having no direct electrical connection thereto, and at the same time, of utilizing the multiplicative advantage of multiple turns of fiber and wire. As a result, the invention has sensing applications in remote and hazardous locations and, therefore, can be used as a nuclear reactor monitor, a power line current/voltage monitor, a magneto-optic flux transformer monitor and wherever the presence of strong broadband EMI requires a sensor tuned to a particular frequency.

Therefore, what has been described is a fiber optic Faraday flux transformer sensor which comprises: a closed loop of wire being responsive to a first time-varying magnetic field from a remote source for producing a secondary time-varying magnetic field which varies as a function of the first time-varying magnetic field, and an optical fiber loop having a plurality of turns arranged in a preselected configuration adjacent to the closed loop of wire and adapted to receive and pass therethrough input light having a fixed state of linear polarization. The optical fiber loop is responsive to the secondary time-varying magnetic field and to the input light for producing light having a polarization state which changes as a function of the secondary time-varying magnetic field applied thereto.

In a first embodiment of the invention, the plurality of turns of optical fiber in the optical fiber loop are preferably wound in a toroidal configuration around the closed loop of wire. In a second embodiment of the invention, the closed loop of wire is comprised of a looped portion of wire preferably wound in a toroidal configuration around the optical fiber loop and a pick-up loop of wire serially connected to the looped portion of wire to form in combination the closed loop of wire.

In a system implementation, an optical source transmits light having a linear state of polarization to a first polarizer, which selects and sends a fixed predetermined state of polarization to the fiber optic Faraday flux transformer sensor. A second polarizer converts the resultant light from the fiber optic Faraday flux transformer sensor into an output light which changes in intensity as a function of the changing polarization state of the resultant light. A photodetector converts this output light into an electrical signal which varies in amplitude as a function of the time-varying magnetic field from the remote source.

It should therefore readily be understood that many modifications and variations of the present invention are possible within the purview of the claimed invention. It is therefore to be understood that, within the scope of the appended claims, the invention may be practiced otherwise than as specifically described.

What is claimed and desired to be secured by Letters Patent of the United States is:

1. A fiber optic Faraday sensor comprising:
    a closed loop of wire being responsive to a first time-varying magnetic field from a remote source for producing a secondary time-varying magnetic field which varies as a function of the first time-varying magnetic field; and
    an optical fiber loop having a plurality of turns arranged in a preselected configuration adjacent to said closed loop of wire and adapted to receive and pass therethrough input light having a fixed state of linear polarization, said optical fiber being responsive to the secondary time-varying magnetic field and to the input light for producing an output light having a polarization state which rotates as a function of the secondary time-varying magnetic field applied thereto, said plurality of turns of optical fiber being wound in a toroidal configuration around said closed loop of wire.

2. A fiber optic Faraday sensing system for measuring a time-varying magnetic field from a remote source, said fiber optic Faraday sensing system comprising:
    means for producing light having a fixed predetermined state of linear polarization;
    a fiber optic Faraday flux transformer sensor adapted to receive the light having the fixed predetermined state of linear polarization and being responsive to the time-varying magnetic field from the remote source for producing a light having a polarization state which changes as a function of the time-varying magnetic field applied thereto, said fiber optic Faraday flux transformer sensor comprising:
        a closed loop of wire being responsive to the time-varying magnetic field from the remote source for producing a secondary time-varying magnetic field which varies as a function of the time-varying magnetic field from the remote source; and
        an optical fiber loop having a plurality of turns arranged in a preselected configuration adjacent to said closed loop of wire and adapted to receive and pass therethrough the light from said producing means having the fixed predetermined state of linear polarization, said plurality of turns of optical fiber loop being wound in a toroidal configuration around said closed loop of wire, and said optical fiber loop being responsive to the secondary time-varying magnetic field for producing the light having the polarization state which changes as a function of the time-varying magnetic field applied thereto from the remote source; and
    means responsive to the light from said fiber optic Faraday flux transformer sensor for developing an electrical signal which varies in amplitude as a function of the time-varying magnetic field from the remote source.

* * * * *